US008848942B2

(12) United States Patent
Radcliffe et al.

(10) Patent No.: US 8,848,942 B2
(45) Date of Patent: Sep. 30, 2014

(54) ACOUSTIC BEAM FORMING ARRAY USING FEEDBACK-CONTROLLED MICROPHONES FOR TUNING AND SELF-MATCHING OF FREQUENCY RESPONSE

(75) Inventors: Eliott Radcliffe, Washington, DC (US); Ahmed Naguib, Ann Arbor, MI (US); William M. Humphreys, Jr., Newport News, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 366 days.

(21) Appl. No.: 13/231,386

(22) Filed: Sep. 13, 2011

(65) Prior Publication Data

US 2013/0064391 A1 Mar. 14, 2013

(51) Int. Cl.
*H03G 5/00* (2006.01)
*H04R 3/00* (2006.01)

(52) U.S. Cl.
CPC ........ *H04R 3/00* (2013.01)
USPC ........ 381/92; 381/98

(58) Field of Classification Search
USPC ........ 381/92, 95, 98, 111–115, 355–356, 381/176, 190, 430
See application file for complete search history.

(56) References Cited

U.S. PATENT DOCUMENTS

| | | | | |
|---|---|---|---|---|
| 4,947,859 A * | 8/1990 | Brewer et al. | ........ | 600/528 |
| 5,748,758 A * | 5/1998 | Menasco et al. | ........ | 381/176 |
| 7,068,796 B2 * | 6/2006 | Moorer | ........ | 381/92 |
| 8,085,957 B2 * | 12/2011 | Shishov et al. | ........ | 381/191 |

OTHER PUBLICATIONS

E. Radcliffe, et al., "A Novel Design of a Feedback-controlled Optical Microphone for Aeroacoustics Research" Meas. Sci. Technol., 21 (2010) 105208, Sep. 14, 2010, pp. 1-11.

E. Radcliffe, et al., "Design and characterization of an optical feedback-controlled microphone for aeroacoustics research," Bulletin of the American Physical Society, 62nd Annual Meeting of the APS Division of Fluid Dynamics. vol. 54. No. 19, Nov. 22-24, 2009, Minneapolis, Minnesota.

* cited by examiner

*Primary Examiner* — Duc Nguyen
*Assistant Examiner* — Phan Le
(74) *Attorney, Agent, or Firm* — Andrea Z. Warmbier

(57) ABSTRACT

A feedback-controlled microphone includes a microphone body and a membrane operatively connected to the body. The membrane is configured to be initially deflected by acoustic pressure such that the initial deflection is characterized by a frequency response. The microphone also includes a sensor configured to detect the frequency response of the initial deflection and generate an output voltage indicative thereof. The microphone additionally includes a compensator in electric communication with the sensor and configured to establish a regulated voltage in response to the output voltage. Furthermore, the microphone includes an actuator in electric communication with the compensator, wherein the actuator is configured to secondarily deflect the membrane in opposition to the initial deflection such that the frequency response is adjusted. An acoustic beam forming microphone array including a plurality of the above feedback-controlled microphones is also disclosed.

20 Claims, 2 Drawing Sheets

FIG. 3
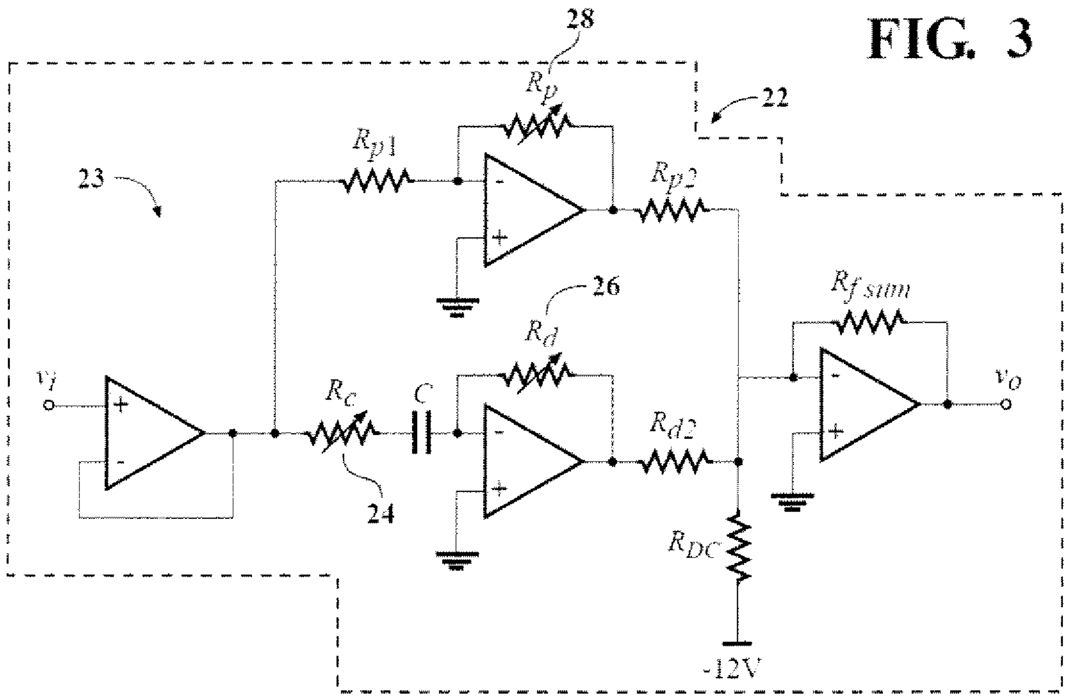
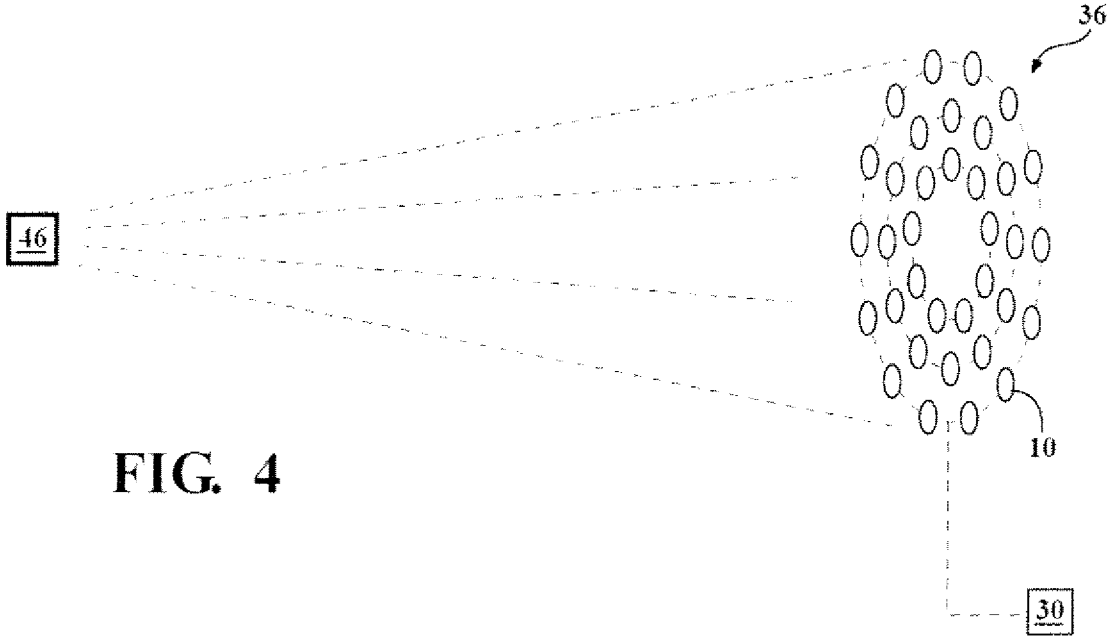
FIG. 4

ACOUSTIC BEAM FORMING ARRAY USING FEEDBACK-CONTROLLED MICROPHONES FOR TUNING AND SELF-MATCHING OF FREQUENCY RESPONSE

STATEMENT REGARDING FEDERALLY SPONSORED RESEARCH OR DEVELOPMENT

The invention described herein was made in the performance of work under a NASA contract and by an employee of the United States Government and is subject to the provisions of Public Law 96-517 (35 U.S.C. §202) and may be manufactured and used by or for the Government for governmental purposes without the payment of any royalties thereon or therefore. In accordance with 35 U.S.C. §202, the contractor elected not to retain title.

TECHNICAL FIELD

The present disclosure is drawn to an acoustic beam forming array using feedback-controlled microphones for tuning and self-matching of frequency response.

BACKGROUND OF THE INVENTION

Beam forming microphone arrays are frequently used for high fidelity localization or isolation of acoustic sources. Generally, these arrays contain large microphone counts, typically ranging from a few dozen to hundreds.

The operating principle of these arrays derives from the propagation delay from a noise source to a given microphone in the array. Knowledge of the delay time for each microphone in the array can be exploited to resolve the location of an acoustic source. The classical beam forming method involves discrete time-shifting of each digitally acquired microphone signal for localization of acoustic sources, while more modern methods use deconvolution and frequency-domain based signal processing.

Accurate and noise-free localization of sound sources typically requires precise frequency response from the individual microphones in such arrays. In an effort to provide the required accuracy, conventional instrument grade condenser microphones are individually calibrated by the respective manufacturers and exhibit a high degree of precision. However, the cost associated with such individual calibration is considerable.

Less expensive microphone technologies, such as electret or microelectromechanical systems (MEMS), are also available. Such lower cost technologies, however, are typically incapable of providing the necessary sensitivity and matched frequency response among all the microphones in a particular array. Furthermore, the frequency response of most microphones tends to drill when exposed to environmental effects such as temperature and humidity.

SUMMARY OF THE INVENTION

A feedback-controlled microphone includes a microphone body and a membrane operatively connected to the body. The membrane is configured to be initially deflected by acoustic pressure such that the initial deflection is characterized by a frequency response. The microphone also includes a sensor configured to detect the frequency response of the initial deflection and generate an output voltage indicative thereof. The microphone additionally includes a compensator in electric communication with the sensor and configured to establish a regulated voltage in response to the output voltage. Furthermore, the microphone includes an actuator in electric communication with the compensator, wherein the actuator is configured to secondarily deflect the membrane in opposition to the initial deflection such that the frequency response is adjusted.

The microphone may also include a cap connected to the body. In such a case, the membrane may be sandwiched between the cap and the body. Each of the cap and the body may be configured to conduct electric current from the actuator to the membrane.

The sensor may be one of an electrostatic, electrodynamic, optical, piezolelectric, and piezoresistive type. The optical sensor may be a fiber-optic lever type or an interferometer type.

The compensator may include at least one programmable resistor subjected to the output voltage and configured to facilitate establishing of the regulated voltage.

The membrane may be characterized by a piezoelectric property and may be configured to secondarily deflect in response to the regulated voltage.

The membrane may be formed from a polyvinylidinefluoride (PVDF) film. In such a case, the actuator may be a piezoelectric driver configured to establish the regulated voltage across the membrane.

The membrane may be dome-shaped.

An acoustic beam forming microphone array including a plurality of the above described feedback-controlled microphones is also disclosed.

The microphone array may include a controller. In such a case, the frequency response of the membrane may be adjusted via the controller to match the frequency response of a membrane of another of the plurality of microphones.

The above features and advantages and other features and advantages of the present invention are readily apparent from the following detailed description of the best modes for carrying out the invention when taken in connection with the accompanying drawings.

BRIEF DESCRIPTION OF THE DRAWINGS

FIG. 3 is a schematic circuit diagram of a compensator used in the feedback-controlled microphone depicted in FIG. 1; and FIG. 4 is a schematic depiction of an acoustic beam forming microphone array that includes a plurality of microphones of the type depicted in FIG. 1.

DETAILED DESCRIPTION OF THE INVENTION

Figure 1:
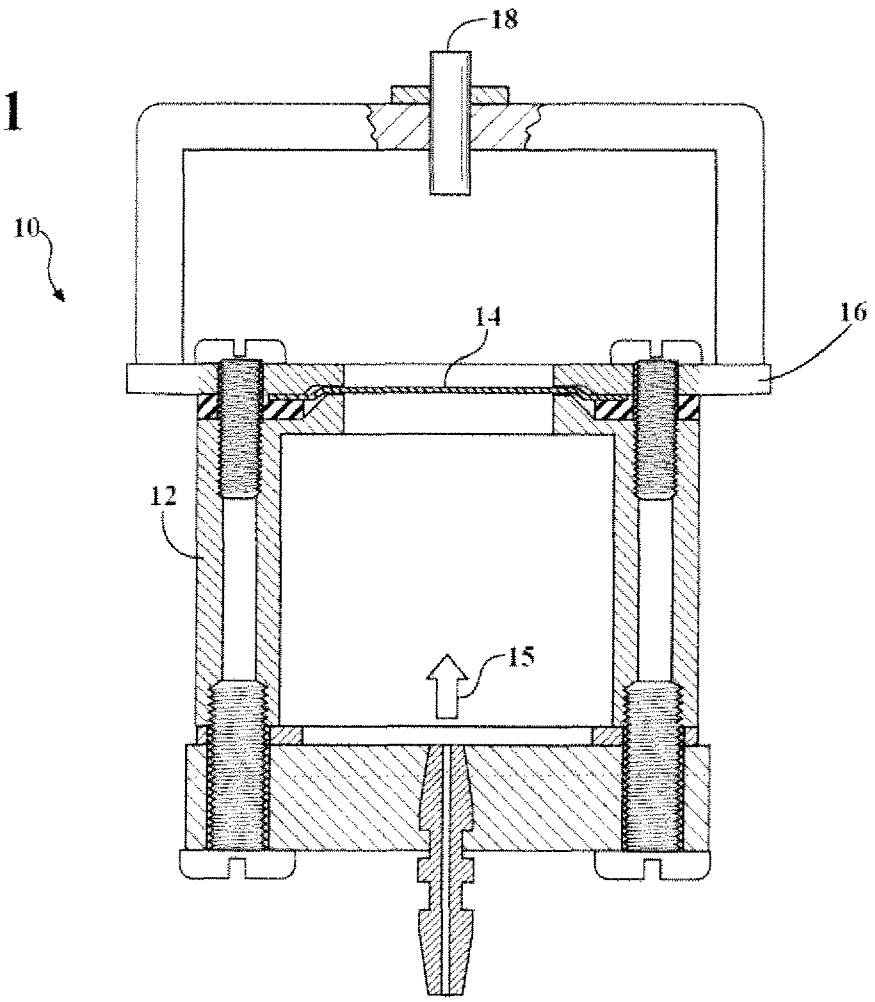
FIG. 1 is a schematic cross-sectional view of a feedback-controlled microphone.

Referring to the drawings, wherein like reference numbers refer to like components, FIG. 1 shows a schematic cross-sectional view of a feedback-controlled microphone 10. Generally, a microphone is an acoustic-to-electric transducer or sensor that converts sound being emitted by a source into an electrical signal. Accordingly, the microphone 10 is configured to provide a specific frequency response to a particular incident acoustic pressure to generate a representative electrical signal which is then communicated to external signal processing equipment. As used herein, the term "frequency response" describes the bandwidth, phase response, and sensitivity of the microphone 10 over the particular bandwidth. An accurate frequency response is critical in establishing precise localization or reproduction of the sound source.

The microphone 10 includes a housing or body 12 and a membrane 14 operatively connected to the body. The membrane 14 is configured to be initially deflected by acoustic pressure waves 15 such that the initial deflection of the membrane is characterized by a frequency response. Furthermore, the membrane 14 may be characterized by a piezoelectric property that induces a secondary deflection of the membrane in response to an applied voltage. Specifically, the membrane 14 may be formed from a relatively thin polyvinylidinefluoride (PVDF) film characterized by a metalized surface. Accordingly, such a PVDF film used for the membrane 14 is capable of deflecting in response to applied voltage as well as incident acoustic pressure. The surface of the membrane 14 that is exposed to the incident acoustic pressure may either be substantially flat or curved, i.e., dome-shaped or convex-shaped. A dome-shape on a PVDF type of membrane 14 may provide greater and more accurate response than a flat shape. A dome-shape of the membrane 14 may be induced by applying an electric field across the PVDF film while the membrane 14 is being stretched over a conductive sphere at a specific temperature. Also, a curvature may also be induced on the membrane 14 by specific material treatments or mounting methods with respect to the body 12.

Figure 2:
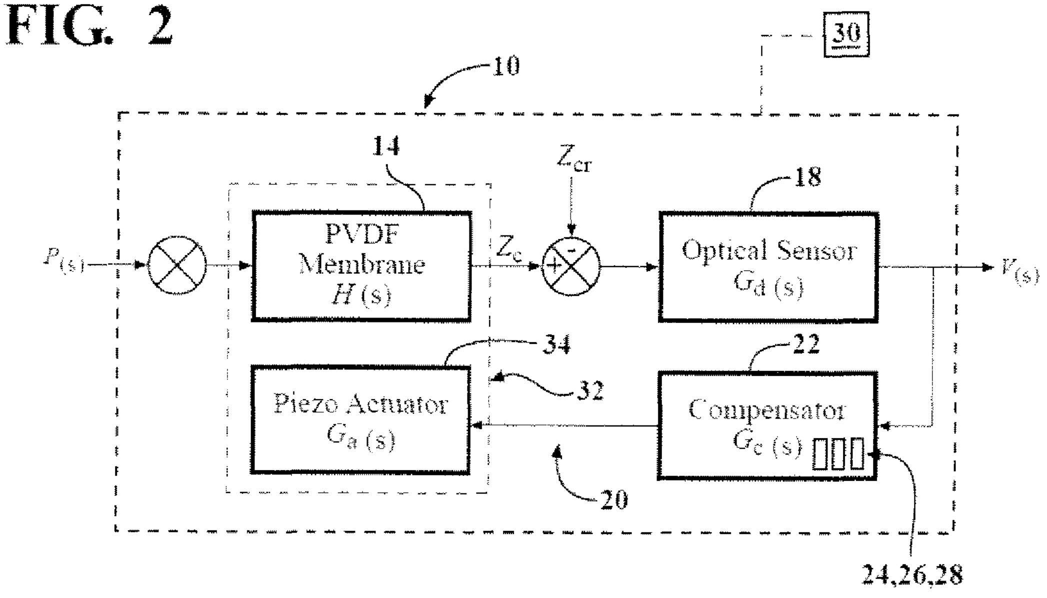
FIG. 2 is a block diagram of the feedback-controlled microphone depicted in FIG. 1.

As shown in FIG. 1, the microphone 10 also includes a cap 16 mounted to the body 12. The membrane 14 is sandwiched between the cap 16 and the body 12. As shown in FIG. 2, the microphone 10 also includes a sensor 18. The sensor 18 is configured to detect the frequency response of the initial deflection of the membrane 14, and is also configured to generate an output voltage indicative thereof. The sensor 18 may be either an electrostatic, electrodynamic, optical, piezolelectric, or piezoresistive type. Specifically, the sensor 18 may be configured as a fiber-optic lever type. Generally, a fiber-optic lever is a type of a sensor that detects displacement of a reflective surface. Such a sensor is typically constructed from both transmitting and receiving fibers, wherein the light that exits the transmitting fibers is reflected off the reflective surface. Generally, when the fiber-optic lever sensor is aimed at a reflective surface, light emitted from the sensor's transmitting fiber probe tip (not shown) is reflected back into the sensor's bundled receiving fibers, where the light is detected by a photodetector. Accordingly, the output of the photodetector will be a function of the separation distance between the probe tip and the reflective surface.

In particular, the output voltage of the fiber-optic lever sensor increases linearly with the gap size between the probe tip and the membrane 14. Generally, the fiber-optic lever sensor is aimed at the center of the PVDF membrane 14 in order to sense the maximum displacement of the membrane. A different type of sensor, for example an interferometer, may also be used to measure average displacement of the membrane 14 over a fraction of the membrane's surface. The combination of the sensor 18 and the membrane 14 defines the open-loop operation of the microphone 10, where the output voltage of the optical sensor is solely a function of the acoustic pressure acting on the membrane and the membrane's dynamics.

As shown in FIG. 2, the microphone 10 additionally includes a feed-back loop 20 to provide real-time self-calibration and control of the microphone's frequency response. The feed-back loop is integrated into the microphone 10 in order to detect and counteract the initial deflection of the membrane 14 that is caused by incident sound pressure. To such an end, the microphone 10 uses an opposing pressure applied to the membrane 14 that is produced by electrostatic, electromagnetic, or other electrical means to alter the microphone's dynamics, permitting calibration of the microphone at the acoustic source sensing site. Accordingly, the feed-hack loop 20 provides the capability to tune the microphone 10 in order to compensate for varying environmental factors, such as temperature, humidity, and contaminants.

With continued reference to FIG. 2, the feed-back loop 20 includes a compensator 22. The compensator 22 is in electric communication with the sensor 18 and is configured to establish a regulated voltage in response to the output voltage. The above-noted piezoelectric property of membrane 14 is used during feed-back loop actuation of the membrane such that the membrane secondarily deflects in response to the regulated voltage established by the compensator 22. As shown in FIG. 3, the compensator 22 may be a phase-lead type that uses an operation amplifier (op-amp) based circuit 23. The circuit 23 may include a plurality of programmable resistors 24, 26, and 28 subjected to the output voltage, shown herein as three distinct digital potentiometers.

Each programmable resistor 24, 26, and 28 is configured to facilitate establishing of the regulated voltage by having its resistance value varied on demand. Off-the-shelf representative potentiometers may be used which typically have values of 10 kΩ, 50 kΩ, or 100 kΩ. Using a serial interface, such potentiometers can typically be programmed with as many as 256 resistance increments. By placing two of such potentiometers in parallel, as many as $2^{16}$ possible resistance increments may be achieved. Accordingly, circuit 23 constructed with such programmable resistors 24, 26, 28 may be used to achieve a high degree of precision in achieving the desired regulated voltage while eliminating the need for manual control of electrical parameters of the circuit.

The feed-back loop 20 may be controlled via an external means, such as a controller 30. Accordingly, as shown schematically in FIG. 3, each programmable resistor 24, 26, and 28 may be configured as a digital potentiometer that is regulated via the controller 30 based on a comparison of the frequency response of the membrane 14 with an ideal frequency response for a particular acoustic pressure 15. Furthermore, the ideal frequency response may be programmed into a readily accessible long-term non-transient memory of the controller 30. Although specifically three programmable resistors 24, 26, 28 are shown, depending on the actual implemented electric circuitry, the number of programmable resistors may either be greater or smaller.

With reference to FIG. 2, as shown the feed-back loop 20 also includes a feedback actuating block 32 that incorporates the membrane 14 and an actuator 34. The actuator 34 is in electric communication with the compensator 22 and is configured to secondarily deflect the membrane 14 in opposition to the initial deflection such that the frequency response is adjusted. Therefore, the sensing function performed by the sensor 18 and the actuation function performed by the actuator 34 are decoupled in the microphone 10. The actuator 34 may be configured as an electrostatic, electrodynamic, or a piezoelectric transducer or driver. In the case where the membrane 14 is formed from the PVDF film or another piezoelectric material, the actuator 34 may be a piezoelectric driver that is configured to establish the regulated voltage across the membrane. Each of the body 12 and the cap 16 of FIG. 1 may be configured to conduct electric current such that the regulated voltage may be established across the membrane 14. Alternatively, the electric current may be conducted from the actuator 34 to the membrane 14 through a dedicated conducting medium (not shown).

Overall, the actuator 34 induces an electrical equivalent pressure on the membrane 14 that acts in opposition to the acoustic pressure 15. Accordingly, in the embodiment described above, the basis for negative feedback in the feedback loop 20 is provided by the piezoelectric properties of the membrane 14 and the voltage established across the membrane by the actuator 34. As shown in FIG. 4, a plurality of microphones 10 may be used in a beam forming array 36 used for high fidelity localization or isolation of acoustic sources. The beam forming array 36 may therefore employ the feedback control capability of the microphones 10 to actively modify and match parameters of the individual microphones in the array such that the accuracy of the subject measurements is enhanced.

As noted above, the sensing and actuation functions are decoupled in the microphone 10. Consequently, the above-noted decoupling of the sensing and actuation functions in the microphone 10 allows for "self-calibration" and matching of the frequency responses between all the microphones in the array 36. Therefore, the frequency response of the membrane 14 of a particular microphone 10 may be adjusted via the controller 30 to match the frequency response of the membrane 14 of another of the plurality of microphones in the array 36. Such self-calibration and matching of the microphones 10 may therefore be accomplished without the necessity of a separate acoustic calibration facility. Accordingly, the self-calibration provision of the microphone 10 would permit the beam forming array 36 to be calibrated immediately before performing the desired measurements, with the array being exposed to the environment and ambient conditions of the subject acoustic source.

In the array 36 shown in FIG. 4, the membrane 14 (see FIGS. 1 and 2) of each microphone 10 functions as the physical plant in the respective feedback-loop 20. The membrane 14 experiences a deflection (Z) as a result of pressure acting on its surface. A variety of methods can be used in constructing the membrane 14. In general, however, the membrane 14 is configured as a stretched, circular or square section of a thin polymer or metallic film.

For such a configuration, the dynamics of the of the membrane 14 of FIGS. 1 and 2 may be described by the linear wave equation 38 for a stretched membrane modeled in the Laplace domain:

$$T\nabla^2 z + p = \rho_s \frac{\partial^2 z}{\partial t^2} \tag{38}$$

In the equation 38, the term T is edge tension of membrane 14 in N/m, $\rho_s$ represents the surface density of the membrane 14 in kg/m$^2$, z=z(r,θ,t)=z(x,y,t) is membrane deflection in either cylindrical (r,θ,t) or rectangular (x,y,t) coordinates, and p=p (r,θ,t)=p(x,y,t) is pressure in either cylindrical or rectangular coordinates. Additionally, the term $\nabla^2$ is the Laplacian operator, while the term $$\frac{\partial^2 z}{\partial t^2}$$

represents a second derivative of the membrane deflection z with respect to time t. Because equation 38 is that of second order in both time and space, an infinite number of vibrational modes, each with a unique frequency response function, is possible.

In general, the transfer function of the output voltage of the sensor 18 can be modeled via equation 40:

$$H(s) = \frac{V(s)}{P(s)} = \sum_{m=0}^{N} F_m \frac{1}{s^2 + 2\varsigma_m \omega_m s + \omega_m^2} \tag{40}$$

In the equation 40, the term H(s) represents the transfer function of the membrane 14, and relates the output voltage V(s) of the sensor 18 to the input acoustic pressure 15 represented by P(s). The term in is the modal index, the term N is the number of modes retained in the model, the term $\zeta_m$ is the damping ratio for the m$^{th}$ mode, and the term $\omega_m$ is the natural frequency of the m$^{th}$ mode. The term $F_m$ is a participation factor that describes the relative contribution of the m$^{th}$ mode and which can be experimentally observed.

As shown in FIG. 2, pressure acting on the membrane 14 results in a deflection Z of the membrane. A reference, or un-deflected state $Z_r$, is subtracted from the deflection Z. The difference between Z and $Z_r$ is measured by the sensor 18. As noted above, the sensor 18 can use any of a variety of displacement sensing technologies, including electrostatic, electrodynamic, optical, piezoelectric, or piezoresistive sensing. As such, the sensor 18 may be configured to measure either displacement or velocity of the deflection Z of the membrane 14. Consequently, where the sensor 18 measures displacement, the sensor may be represented by a sensitivity factor $K_d$ with units of Volts/meter, while a sensor 18 measuring velocity may be represented by $K_v s$, where $K_v$ can be represented in units of Volts*seconds/meter.

The compensator 22 is configured to satisfy a set of user specified conditions for the microphone 10 in closed-loop operation. One configuration of the compensator 22 that maybe selected for the microphone 10 is pole-placement using a phase-lead compensator. In such a design, closed-loop response parameters of the zeroth vibrational mode, including natural frequency ($\omega_{0,CL}$) damping ($\zeta_{0,CL}$) and DC attenuation will be specified. A calculation of phase-lead parameters $a_0$, $a_1$, and $b_1$ may then be performed in the compensator transfer function 42 which takes the form:

$$G_c(s) = \frac{a_1 s + a_0}{b_1 s + 1} = K_p + \frac{K_d s}{\tau_d s + 1} \tag{42}$$

In the equation 42, the term $K_p$ represents the proportional gain and the term $K_d$ represents the derivative gain of the compensator 22, the term $\tau_d$ represents the derivative time constant, and the term $G_c(s)$ represents the gain of the compensator 22.

Finally, with the addition of the compensator 22 and the actuator 34 to the general transfer function equation of the output voltage of the sensor 18, the transfer function of the output voltage of the microphone 10 operating in closed-loop mode may be represented by equation 44:

$$\frac{V(s)}{P(s)} = \frac{H(s)G_d(s)}{1 + H(s)G_d(s)G_c(s)G_a(s)} \tag{44}$$

In the equation 44, the term $G_d(s)$ represents the gain of the sensor 18, the term $G_c(s)$ represents the gain of the compensator 22, and the term $G_a(s)$ represents the gain of the actuator 34.

In accordance with the above mathematical model, the beam forming array 36 may be used for acoustic measurement and post-processing as generally practiced in the industry. The primary modification to the operating procedure of the array 36 is the programming of the controller 30 with the closed-loop frequency response of each microphone 10 and calibration of individual microphones at the measurement site. The beam forming the array 36 can be preconfigured for on-site localization of a source 46 shown in FIG. 4 by employing the following process. The membrane 14 of each microphone 10 may be calibrated using electrical excitation to determine open-loop response of the particular membrane.

Additionally, the transfer function of each microphone 10 may be modeled to determine each individual membrane's open-loop resonant frequencies $\omega_m$ and damping $\zeta_m$. After calibration has been performed on each of the microphones 10 in the array 36, closed-loop response parameters, $\omega_{0,CL}$, and $\zeta_{0,CL}$ of each individual membrane may be specified. The closed-loop parameters may then be applied to all microphones 10 in the array 36 such that they will have matching closed-loop response. If desired, DC attenuation can be specified for further matching. Furthermore, the circuit 23 of each compensator 22 may be designed in accordance with the above-established parameters.

Based upon the desired closed-loop frequency response and open-loop parameters identified by electrical actuation, the controller 30 may be used to determine the necessary phase-lead parameters $a_1$, $a_0$, and $b_1$ for each compensator 22 used in the array 36. Because each compensator 22 is associated with an individual microphone 10, a unique $a_1$, $a_0$, and $b_1$ may be specified for each distinct compensator. The above processing steps may be performed using a combination of software via the controller 30, hardware, and human interaction. During actual operation of the array 36 the individual resistance values of the potentiometers 24, 26, 28 in each circuit 23 may be varied via the controller 30 to specify the desired frequency response of each microphone 10 in order to self-calibrate and match all the microphones in the array.

While the best modes for carrying out the invention have been described in detail and example configurations of the invention have been herein illustrated, shown and described, it is to be appreciated that various changes, rearrangements and modifications may be made therein, without departing from the scope of the invention as defined by the appended claims. It is intended that the specific embodiments and configurations disclosed are illustrative of the preferred and best modes for practicing the invention, and should not be interpreted as limitations on the scope of the invention as defined by the appended claims and it is to be appreciated that various changes, rearrangements and modifications may be made therein, without departing from the scope of the invention as defined by the appended claims.

The invention claimed is:

1. A feedback controlled microphone comprising:

a microphone body;

a membrane operatively connected to the body and configured to be initially deflected by acoustic pressure such that the initial deflection is characterized by a frequency response;

a sensor configured to detect the frequency response of the initial deflection and generate an output voltage indicative thereof;

a compensator in electric communication with the sensor and configured to establish a regulated voltage in response to the output voltage; and an actuator in electric communication with the compensator, wherein the actuator is configured to secondarily deflect the membrane in opposition to the initial deflection based on the regulated voltage such that the frequency response of the initial deflection is adjusted.

2. The microphone of claim 1, further comprising a cap connected to the body, wherein the membrane is sandwiched between the cap and the body.

3. The microphone of claim 2, wherein each of the cap and the body is configured to conduct electric current from the actuator to the membrane.

4. The microphone of claim 1, wherein the sensor is one of an electrostatic, electrodynamic, optical, piezolelectric, and piezoresistive type.

5. The microphone of claim 4, wherein the optical sensor is a fiber-optic lever type configured to detect displacement of a reflective surface of the membrane based on light reflected off the reflective surface.

6. The microphone of claim 1, wherein the compensator includes at least one programmable resistor subjected to the output voltage and configured to facilitate establishing of the regulated voltage.

7. The microphone of claim 1, wherein the membrane is characterized by a piezoelectric property and is configured to secondarily deflect in response to the regulated voltage.

8. The microphone of claim 7, wherein, the membrane comprising a polyvinylidinefluoride (PVDF) film.

9. The microphone of claim 7, wherein the actuator is a piezoelectric driver configured to establish the regulated voltage across the membrane.

10. The microphone of claim 1, wherein the membrane is dome-shaped.

11. An acoustic beam forming microphone array comprising:

a plurality of feedback-controlled microphones configured to determine a location of a sound source by detecting a propagation delay between the sound source and each of the microphones, wherein each of the microphones in the array includes:

a microphone body;

a membrane operatively connected to the body and configured to be initially deflected by acoustic pressure such that the initial deflection is characterized by a frequency response;

a sensor configured to detect the frequency response of the initial deflection and generate an output voltage indicative thereof;

a compensator in electric communication with the sensor and configured to establish a regulated voltage in response to the output voltage; and an actuator in electric communication with the compensator, wherein the actuator is configured to secondarily deflect the membrane in opposition to the initial deflection based on the regulated voltage such that the frequency response of the initial deflection is adjusted.

12. The microphone array of claim 11, wherein each of the microphones additionally includes a cap connected to the body, wherein the membrane is sandwiched between the cap and the body.

13. The microphone array of claim 12, wherein each of the cap and the body is configured to conduct an electric current from the actuator to the membrane.

14. The microphone array of claim 11, wherein the sensor is one of an electrostatic, electrodynamic, optical, piezolelectric, and piezoresistive type.

15. The microphone array of claim 14, wherein he optical sensor is a fiber-optic lever type configured to detect displacement of a reflective surface of the membrane based on light reflected off the reflective surface.

16. The microphone array of claim 11, wherein the compensator includes at least one programmable resistor subjected to the output voltage and configured to facilitate establishing of the regulated voltage.

17. The microphone array of claim 11, wherein the membrane is characterized by a piezoelectric property and is configured to secondarily deflect in response to the regulated voltage, and wherein the actuator is a piezoelectric driver configured to establish the regulated voltage across the membrane.

18. The microphone array of claim 11, further comprising a controller, wherein the frequency response of the membrane is adjusted via the controller to match the frequency response of another of the plurality of microphones a resistance of at least one resistor of the compensator.

19. The microphone array of claim 11, wherein the sensors self-calibrate by supplying a known voltage to the actuator in open-loop operation, and the membrane deflection is measured by the sensor to determine the frequency response of each microphone in the array.

20. The microphone of claim 1, wherein the microphone is a first microphone within a microphone array comprising a plurality of microphones, wherein the sensor of the first microphone and a sensor of a second microphone within the microphone array are configured to self-calibrate, wherein the self-calibration comprises:

supplying a known voltage to the actuator of the respective microphone in open-loop operation; and measuring the deflection by the sensor of the respective microphone to determine the frequency response of each microphone in the array.

* * * * *